United States Patent
Ma et al.

(10) Patent No.: US 10,026,462 B1
(45) Date of Patent: Jul. 17, 2018

(54) APPARATUSES AND METHODS FOR PROVIDING CONSTANT DQS-DQ DELAY IN A MEMORY DEVICE

(71) Applicant: Micron Technology, Inc., Boise, ID (US)

(72) Inventors: Yantao Ma, Boise, ID (US); Huy T. Vo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/596,988

(22) Filed: May 16, 2017

(51) Int. Cl.
G11C 7/10 (2006.01)
G11C 7/22 (2006.01)
G11C 7/20 (2006.01)

(52) U.S. Cl.
CPC .......... *G11C 7/222* (2013.01); *G11C 7/1012* (2013.01); *G11C 7/20* (2013.01)

(58) Field of Classification Search
CPC .......... G11C 7/222; G11C 7/1012; G11C 7/20

USPC ................ 265/193, 189.05; 365/193, 189.05
See application file for complete search history.

(56) References Cited

U.S. PATENT DOCUMENTS

| 2011/0019489 A1* | 1/2011 | Huang | G11C 7/1051 |
| | | | 365/193 |
| 2011/0291717 A1* | 12/2011 | Lee | H03L 7/07 |
| | | | 327/158 |

* cited by examiner

*Primary Examiner* — Huan Hoang
(74) *Attorney, Agent, or Firm* — Dorsey & Whitney LLP

(57) ABSTRACT

Apparatuses and methods for creating a constant DQS-DQ delay in a memory device are described. An example apparatus includes a first adjustable delay line configured to provide a delay corresponding to a loop delay of a data strobe signal pathway internal to a memory, a second adjustable delay line included in the internal data strobe signal pathway, and a timing control circuit coupled to the first and second adjustable delay lines and configured to adjust a delay of the second adjustable delay line responsive to output from the first adjustable delay line and the data strobe signal pathway.

19 Claims, 7 Drawing Sheets

APPARATUSES AND METHODS FOR PROVIDING CONSTANT DQS-DQ DELAY IN A MEMORY DEVICE

BACKGROUND

An external controller that is associated with a memory device may employ a DQS-DQ delay in connection with write operations directed to the memory device. A DQ signal in accordance with the present disclosure is a signal that carries data written from an external controller to a memory device. The DQS signal is a data strobe signal that provides an indication from the external controller to the memory that data is available on the DQ signal lines for capture by the memory. The DQS signal may be received at a memory through a memory pad, pass through an internal signal pathway, and arrive at one or more data latches where the DQS signal clocks the incoming write data carried by the DQ signal. The DQ signal generally lags behind the DQS signal by a certain delay so as to allow the DQS signal to propagate through the internal DQS signal pathway. The amount by which the external controller delays the DQ signal may be set through a DQS training procedure that measures a loop delay associated with the internal DQS signal pathway.

The loop delay of an internal DQS signal pathway may vary under different operating conditions. For example, variations in temperature may cause changes in the rate at which the DQS signal propagates through the various gates or other stages associated with the internal DQS signal pathway. Variations in the power supply voltage of the memory device may also cause changes in the rate that the DQS signal propagates through the internal DQS signal pathway. Process variations may also be a contributing factor to delay variations. The various factors that may affect propagation times in the internal DQS signal pathway are generally referred to herein as PVT variations. Changes in the loop delay of the internal DQS signal pathway that result from PVT variations may result in the DQS-DQ delay of the external controller becoming inaccurate.

Memory devices typically address the issue of a changing loop delay by continually monitoring the loop delay and adjusting the DQS-DQ delay accordingly. In order to track changes in the loop delay, the controller may execute multiple DQS training procedures during the operation of the memory. These extra controller operations can become costly in terms of speed, efficiency, and power consumption. Accordingly, there is a need in the art for a memory to have a DQ-DS delay that is less variable such that an external controller may minimize or eliminate multiple DQS training procedures.

DETAILED DESCRIPTION

The present disclosure is directed to systems and methods for reducing DQS-DQ delay variability in a memory device. Embodiments in accordance with the present disclosure are directed towards making adjustments to an internal DQS signal path when the loop delay varies during operation of the memory device. In this way, the external controller may measure the loop delay once during an initial training procedure and then rely on that measurement throughout the operation of the memory. The external controller may not need to continually measure the loop delay of the internal DQS signal path through repeated training procedures that occur during the operation of the memory.

Embodiments in accordance with the present disclosure are directed to a timing control circuit that includes two adjustable delay lines that operate together to provide appropriate timing of the DQS signal. The first adjustable delay line may be a regulated delay line. As used herein a "regulated" delay line is one that is voltage and temperature compensated to prevent voltage and temperature variations from impacting the rate at which signals propagate through the delay line. In contrast, an "unregulated" delay line is one that is not voltage and temperature compensated. The first adjustable delay line may include a delay that is set through an initialization procedure. Once initialized, the amount of delay provided by the first adjustable delay line becomes fixed and does not change as data is written to the memory. The second adjustable delay line, which forms a portion of an internal DQS signal pathway, may be adjusted based in part on the output of the first adjustable delay line.

Figure 1:
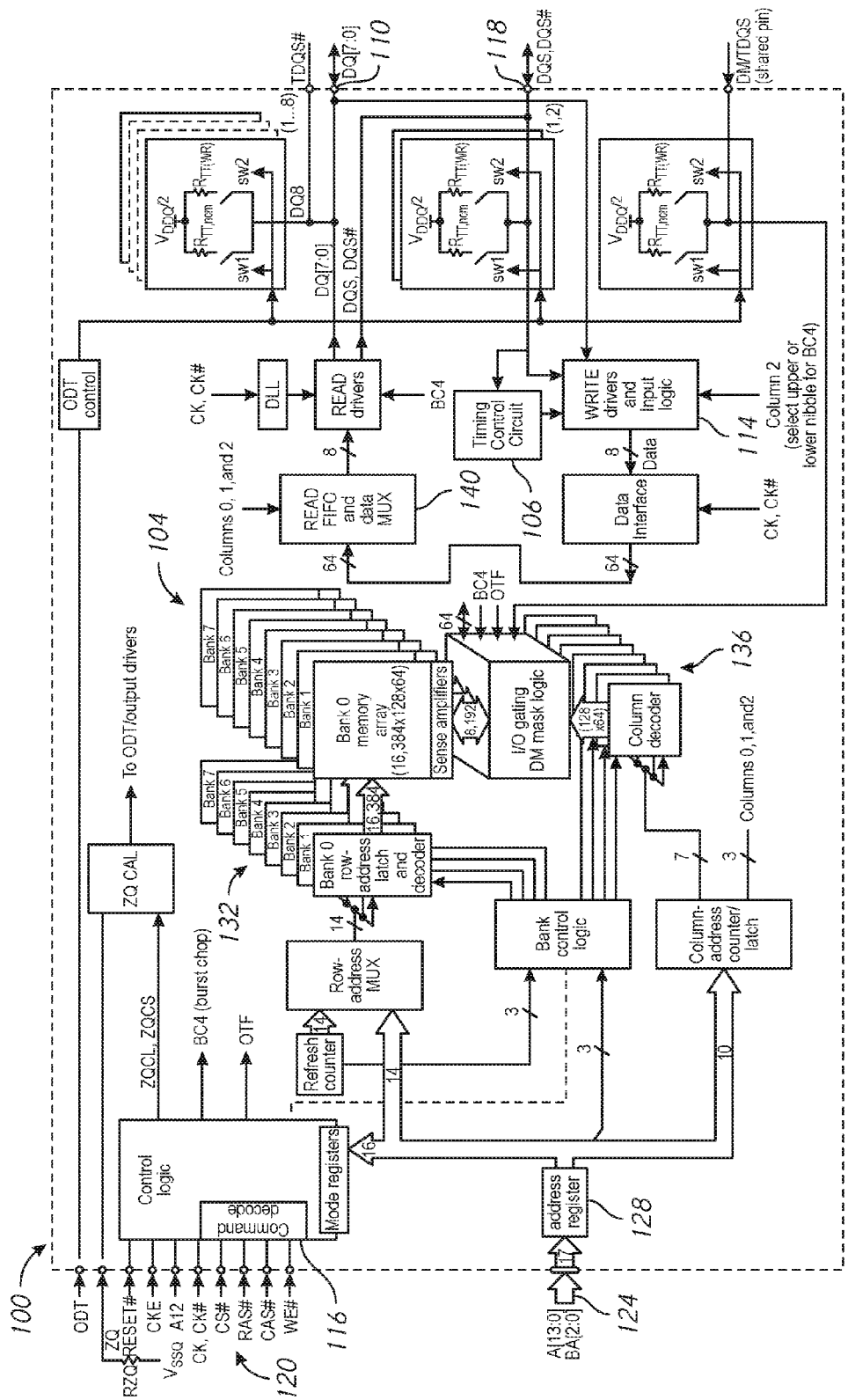
FIG. 1 is a block diagram of a portion of a memory in accordance with an embodiment of the present disclosure.

FIG. 1 is a block diagram of a portion of a memory 100 in accordance with an embodiment of the disclosure. The memory 100 includes an array 104 of memory cells, which may be, for example, DRAM memory cells, SRAM memory cells, flash memory cells, or some other type of memory cells. The memory 100 may be generally configured to operate in cooperation with a larger digital system that includes at least a processor configured to communicate with the memory 100. In the present description, "external" refers to signals and operations outside of the memory 100, and "internal" refers to signals and operations within the memory 100. As an illustrative example, the memory 100 may be coupled to a microprocessor that provides external commands and clock signals to the memory 100. Although examples in the present description are directed to synchronous memory devices, the principles described herein are equally applicable to other types of synchronous integrated circuits.

The memory 100 may be generally configured to execute read and/or write commands received from an external device. Read commands provide data stored in the array 104 to the external device across a data bus DQ. Write commands receive data from the external device across the data bus DQ and store the data in the memory array 104. The following discussion generally references write commands by way of example and not limitation. In writing data to the memory 100, an external controller will drive the data bus DQ with data to be written to the memory array 104 and signal to the memory 100 that the write data is available via a data strobe DQS signal. The data to be written to the memory array 104 is received at the memory 100 through DQ pads 110 and from there to write input logic 114. The DQS signal is received at the memory 100 through a DQS pad 118 and from there through an internal DQS signal pathway to the write input logic 114. When the DQS signal arrives at the write input logic 114, the DQS signal clocks a latch or similar device to capture the write data from the DQ signal lines.

The memory system 100 includes a command decoder 116 that receives memory commands through a command bus 120. The command decoder 116 responds to memory commands applied to the command bus 120 by generating a corresponding control signal to perform various operations on the memory array 104. For example, the command decoder 116 may generate internal control signals to read data from and/or write data to the memory array 104. Row and column address signals associated with a particular command are applied to the memory 100 through an address bus 124. The address bus 124 provides the row and column address signals to an address register 128. The address register 128 then outputs a separate column address and a separate row address to the memory array 104.

As can be seen in FIG. 1, row and column addresses may be provided by the address register 128 to a row address decoder 132 and a column address decoder 136, respectively. The column address decoder 128 selects bit lines extending through the array 104 corresponding to respective column addresses. The row address decoder 132 includes or is coupled to a word line driver or similar component that activates respective rows of memory cells in the array 104 corresponding to received row addresses. The selected data line (e.g., a bit line or bit lines) corresponding to a received column address is coupled to a read/write circuitry 140 to provide read data to a data output buffer or similar component via an input-output data bus 108. Write data is applied to the memory array 104 through a data input buffer or similar component and the memory array read/write circuitry 140.

As mentioned, the DQS signal is received at the memory 100 through the DQS pad 118 and from there travels through an internal DQS signal pathway to the write input logic 114. This internal DQS signal pathway forms a loop that ends when the DQS signal arrives at the write input logic 114 and clocks a latch or similar device to capture the write data from the DQ signal lines. The internal DQS signal pathway may be subject to PVT variations that cause a loop delay of pathway to depart from an initial amount measured during the initialization procedure. Embodiments in accordance with the present disclosure are directed to a timing control circuit 106 that monitors these changes and makes adjustments to an adjustable delay line that forms a portion of the internal DQS signal pathway. In some embodiments of the disclosure, the timing control circuit 106 may monitor for changes and make adjustments during operation of the memory. These adjustments increase or decrease delay of the adjustable delay line to bring the loop delay of internal DQS signal path back into alignment with the loop delay measured during an initialization procedure. In this way, the memory device 100 maintains a constant DQS-DQ delay such that the external control may reduce or eliminate multiple DQS training procedures.

In one respect, the timing control circuit 106 makes adjustments to an adjustable delay line during normal memory operations. As used herein, "normal" memory operations generally include any memory operation or memory state that occurs after the memory has gone through an initialization procedure. Normal memory operations can include read and/or write memory operations where data is read from and written to the memory 100. Normal memory operations may also include an idle state where no particular data transfer operations take place. A timing control circuit embodiment that may make adjustments to an adjustable delay line will now be described with reference to FIG. 2.

Figure 2:
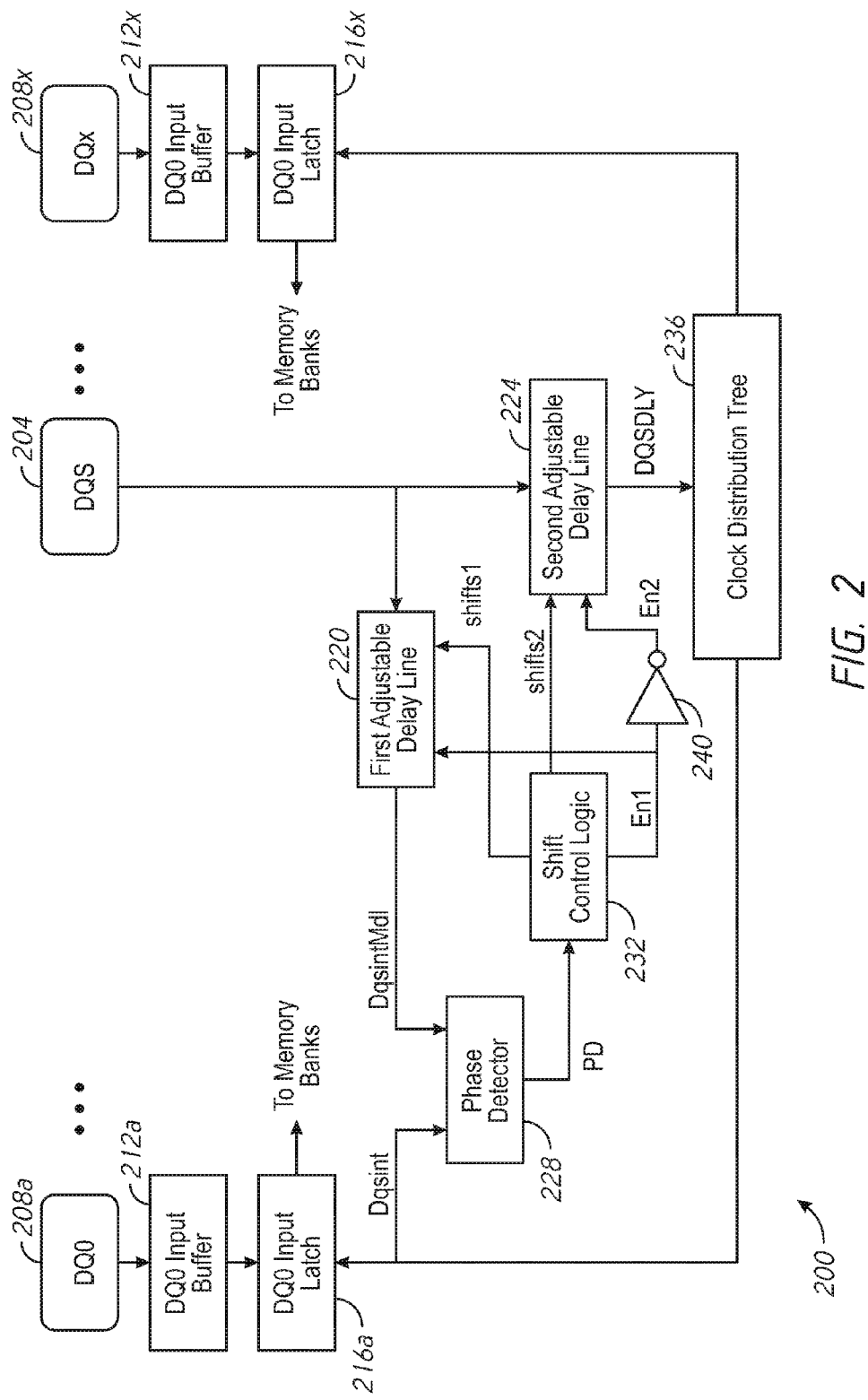
FIG. 2 is a block diagram of a timing control circuit in accordance with an embodiment of the present disclosure.

FIG. 2 is a block diagram of a timing control circuit 200 in accordance with an embodiment of the present disclosure. The timing control circuit 200 is generally configured to control the internal timing of a data strobe signal DQS such that the DQS signal latches data signals DQ0-DQX with appropriate timing. The DQS signal is received as input through DQS pad 204. The DQ0-DQX signals are received as input through DQ pads 208a-x. The DQS signal and DQ0-DQX signals may be provided by an external source that may be, for example, an external controller. Each DQ pad 208a-x is coupled to an input buffer 212a-x. The input buffers 212a-x may be configured to receive data input signals from pads 208a-x and to condition the signals such as by amplification. The input buffers 212a-x provide amplified data signals as output, which are captured by data latches 216a-x responsive to the DQS signal. More specifically, the data latches 216a-x capture the signals provided by the input buffers 212a-x responsive to a version of the externally received DQS signal that has passed through an internal DQS signal pathway. As described in greater detail below, this internal DQS signal pathway includes delay and distribution components that slow the signal relative to the time it is received at the DQS pad 204.

The timing control circuit 200 may be a component of a memory, such as the memory 100 illustrated in FIG. 1. The DQS pad 204 and the DQ pads 208a-x may correspond to the DQS pad 118 and the DQ pads 110 of FIG. 1. As described in connection with FIG. 1, the external source that provides input to the DQS pad 204 and to the DQ pads 208a-x may be an external controller. Furthermore, the input buffers 212a-x and the data latches 216a-x may be components of the write input logic 114 of FIG. 1. As shown in FIG. 2, the data latches 216a-x may provide output in the form of latched data to a memory array. This memory array may correspond to the memory array 104 of FIG. 1. While FIG. 2 illustrates DQ pads 208a and 208x, input buffers 212a and 212x, and data latches 216a and 216x, it will be appreciated that embodiments of the present disclosure may include more DQ pads, input buffers, and data latches than that shown. The number of DQ pads, input buffers, and data latches shown in FIG. 2 has been reduced for the sake of simplicity and is not intended to limit the scope of the present disclosure.

The timing control circuit 200 includes two adjustable delay lines 220, 224 that operate together to provide appropriate timing of the DQS signal. The first adjustable delay line 220 may be a regulated delay line. More specifically, the first adjustable delay line 220 may be voltage and temperature compensated, that is, voltage and temperature variations do not impact the rate at which signals propagate through the first adjustable delay line 220. The first adjustable delay line 220 includes a delay that is set through an initialization procedure. As descried in greater detail below, the initialization procedure generally includes a coarse lock portion and a static lock portion. Once initialized, the amount of delay provided by the first adjustable delay line 220 becomes fixed and does not change as data is written to the memory through the DQS pad 204 and the DQ pads 208a-n.

The second adjustable delay line 224 includes a delay that is set to an initial amount through the initialization procedure. The second adjustable delay line 224 provides a delayed DQS signal, which is indicated in FIG. 2 as DQS-DLY. Unlike the first adjustable delay line 220, the amount of delay provided by the second adjustable delay line 224 does not become fixed after initialization. Instead, the amount of delay provided by the second adjustable delay line 224 is dynamically adjusted during normal memory operations, such as when data is written to the memory through the DQS pad 204 and the DQ pads 208*a*-*x*. The initial amount to which the second adjustable delay line 224 is set may vary depending on the implementation. In some cases, the second adjustable delay line 224 may be centered such that delays may increase or decrease in equal amounts. In other cases, the second adjustable delay line 224 may be initially set to a low amount in anticipation of generally increasing delay as the memory operates.

The second adjustable delay line 224 provides the internal data strobe signal that is used to latch write data at the data latches 216*a*-*x*. In this regard, the second adjustable delay line 224 is part of an internal DQS signal path that additionally includes a clock distribution tree 236. The first adjustable delay line 220 provides a fixed indication of the loop delay for the internal DQS signal path as measured via an initialization procedure. The internal signal path may be subject to PVT variations that cause the loop delay to depart from the initial amount measured during the initialization procedure. The timing control circuit 200 may monitor these changes and make adjustments to the second adjustable delay line 224. These adjustments increase or decrease delay to the second adjustable delay line 220 to bring the loop delay of internal DQS signal path back into alignment with the fixed delay provided by the first adjustable delay line 220. In this way, the loop delay may return to the initial amount measured during the initialization procedure.

As mentioned, the first adjustable delay line 220 may be regulated. In some embodiments, the first adjustable delay line 220 is regulated, while the second adjustable delay line 224 and other portions of the internal DQS signal path are unregulated. These embodiments may be suitable to implementations that have relatively slower clock speeds, which allow for greater tolerance in clock variations. These embodiments may also be used in implementations that have relatively higher power supply voltages, which allow for greater signal voltage margins. In other embodiments, the first adjustable delay line 220, the second adjustable delay line 224 and/or other portions of the internal DQS signal path are regulated. Here, the voltage regulation on the second adjustable delay line 224 and/or other portions of the internal DQS signal path such as the clock distribution tree 236 may provide a first order control on clock signal misalignment. These embodiments may be suitable to implementations that have relatively faster clock speeds, which have lesser tolerance in clock variations. These embodiments may also be used in implementations that have relatively lower power supply voltages, which have smaller signal voltage margins.

The timing control circuit 200 includes a phase detector 228 and shift control logic 232 that are generally configured to provide adjustments to the two adjustable delay lines 220, 224. The phase detector 228 and the shift control logic 232 provide adjustments to the first adjustable delay line 220 during a static lock portion of the initialization procedure. As described in greater detail below, initialization procedure additionally includes a coarse lock operation that sets the first adjustable delay 220 to an initial amount based on a DQS training operation. The phase detector 228 and the shift control logic 232 provide adjustments to the second adjustable delay line 224 as data transfer to the memory is on-going. During these normal data transfer operations, the first adjustable delay line 220 is frozen such that the phase detector 228 and the shift control logic 232 do not provide further adjustments.

The phase detector 228 is generally configured to compare a model delay for the DQS signal to an actual delay experienced by the DQS signal. The model delay signal is provided by the first adjustable delay line 220 and is generally identified as DqsIntMdl. The timing control circuit 200 may set an amount of delay provided by the DqsIntMdl signal during the initialization procedure. The model delay represented by the DqsIntMdl signal then remains fixed during normal operations of the memory. The actual delay is generally identified as Dqsint. The Dqsint signal is the externally received DQS signal, delayed by its travel through an internal DQS signal path. As can be seen in FIG. 2, the internal DQS signal path includes the second adjustable delay line 224 and the clock distribution tree 236, which is configured to distribute a delayed DQS signal to the data latches 216*a*-*x*.

The phase detector 228 compares the DqsIntMdl signal and the Dqsint signal to provide an output signal PD that represents the phase difference between the two input signals. The phase difference signal PD provided as output from the phase detector 228 is received as input at the shift control logic 232. The shift control logic 232 is configured to provide adjustments to the two adjustable delay lines 220, 224 based on the phase signal PD provided by the phase detector 228. The shift control logic 232 provides a control signals shifts1 and shifts2. The shifts1 signal is provided as output to the first adjustable delay line 220. The shifts2 signal is provided as output to the second delay line 224. The shift control logic 232 additionally provides an enable signal En1 that is provided as output to the first adjustable delay line 220. The En1 is additionally provided as output to an inverter 240, which provides a corresponding enable signal En2 to the second adjustable delay line 224.

In operation, the shift control logic 232 may adjust the first adjustable delay line 220 via the shifts1 signal during a static lock portion of an initialization procedure. The shifts1 signal may include a pulse or other symbol that causes a shift register associated with the first adjustable delay line 220 to increase or decrease delay of the first adjustable delay line 220. In an embodiment of the disclosure, the first adjustable delay line 220 includes a plurality of delay stages. Each delay stage increases the delay of the first adjustable delay line 220 by a unit delay when activated and decreases the delay of the first adjustable delay line 220 by the unit delay when deactivated. The number of pulses or other symbols sent may depend on the phase difference between the Dqsint and DqsIntMdl as indicated by the phase difference signal PD. During the initialization phase, the shift control logic 232 may assert the En1 signal so as to enable receipt of shift commands at the first adjustable delay line 220. The asserted En1 is also received at the inverter 240, which in turn generates a de-asserted En2 signal. The de-asserted En2 signal is received at the second adjustable delay line 224 so as to disable receipt of shift commands at the second adjustable delay line 224 during the static clock portion of the procedure.

Once the initialization procedure is complete, the shift control logic 232 may adjust the second adjustable delay line 224 via the shifts2 signal. These adjustments to the second adjustable delay line 224 occur dynamically during normal memory operations such as when data is being written to the memory. The shifts2 signal in this regard may include a pulse or other symbol that causes a shift register associated with the second adjustable delay line 224 to increase or decrease delay of the delay line. The number of pulses or other symbols sent may depend on the phase difference between the Dqsint and DqsIntMdl signals as indicated by the phase difference signal PD. When operating in this mode, the shift control logic 232 may de-assert the En1 signal so as to disable receipt of shift commands at the first adjustable delay line 220. The de-asserted En1 is also received at the inverter 240, which in turn generates an asserted En2 signal. The asserted En2 signal is received at the second adjustable delay line 224 so as to enable receipt of shift commands at the second adjustable delay line 224 during normal operation of the memory.

A second adjustable delay line 224 in accordance with the present disclosure may include both coarse and fine delay components. A particular setting for the coarse delay component may set a range of possible delay values for the second adjustable delay component 224. The fine delay component may then be adjusted to select a particular delay amount within the range of delay amounts defined by the coarse delay component. The particular delay amount selected by the fine delay component may be provided as output from the second adjustable delay line 224. As adjustments are made to the second adjustable delay line 224, it may be the case that delay amounts are required that are outside the range of possible delays defined by the current setting of the coarse delay component. Here, the second adjustable delay line 224 may respond by adjusting the coarse delay component so as to adjust the range of possible delay amounts for the second adjustable delay line. Adjustments to the coarse delay component may shift to a higher or lower range of delay amounts as appropriate depending on current conditions.

Figure 3A:
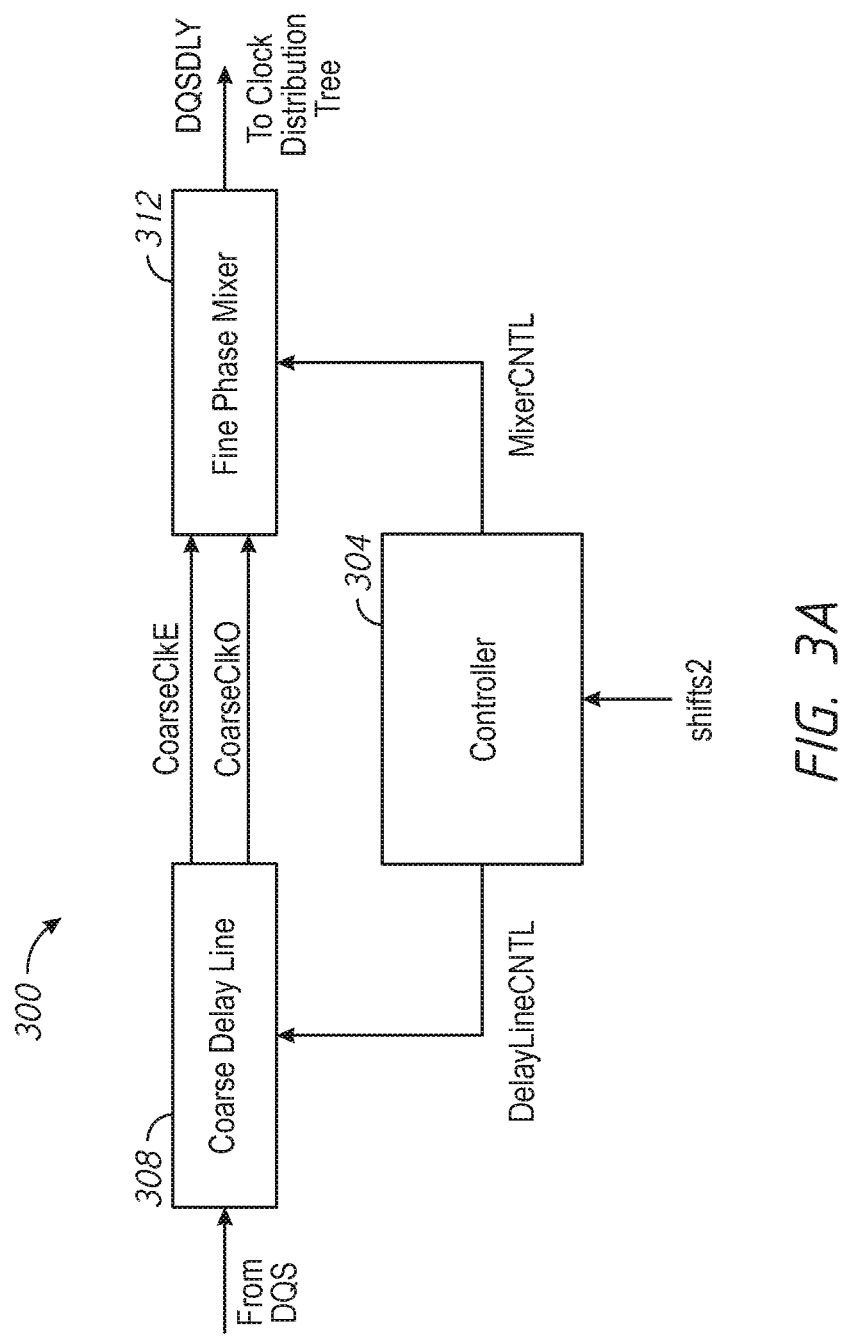
FIG. 3A is a block diagram of an adjustable delay line in accordance with an embodiment of the disclosure.

FIG. 3A is a block diagram of an adjustable delay line 300. In accordance with an embodiment of the disclosure, the adjustable line 300 includes coarse and fine delay components. The adjustable delay line 300 of FIG. 3A may correspond to the second adjustable delay line 224 of FIG. 2 by way of example and not limitation. It should be understood that the first adjustable delay line 220 of FIG. 2 may also have a similar structure as that depicted in FIG. 3A. As shown in FIG. 3A, an adjustable delay line 300 may include a controller 304 that is coupled to a coarse delay component 308 and a fine delay component 312. The coarse delay component 308 receives the data strobe signal DQS as input and provides two output signals CoarseClkE and CoarseClkO. The fine delay component 312 receives CoarseClkE and CoarseClkO as input and provides a single output signal. As indicated in FIG. 3A, the output DQSDLY from the fine delay component 312 may correspond to the output of the second adjustable delay line 224, which is provided to downstream components via a clock distribution tree (FIG. 2). The controller 304 adjusts the amount of delay provided by the coarse delay component 308 via DelayLineCNTL signals. Similarly, the controller 304 adjusts the amount of delay provided by the fine delay component via MixerCNTL signals.

The coarse delay component 308 is generally configured to receive the data strobe signal DQS as input and to provide two delayed outputs CoarseClkE and CoarseClkO. The coarse delay component 308 may generate these signals such that one signal leads and the other lags. In this way, the coarse delay component 308 may define upper and lower bounds for a range of possible delays. For example, it may be the case that CoarseClkE leads CoarseClkO. In this example, the leading CoarseClkE signal defines the lower bound of the delay range and the lagging CoarseClkO defines the upper bound of the delay range. As can be appreciated, it may be the case that the coarse delay component 308 generates output such that CoarseClkO leads CoarseClkE. In this example, the leading CoarseClkO signal defines the lower bound of the delay range and the lagging CoarseClkE defines the upper bound of the delay range.

The coarse delay component 308 may include a number of delay stages that may be added and/or subtracted from a path that a data strobe signal takes through the coarse delay component 308. Adding a delay stage adds a unit of delay to the path through the coarse delay component 308. More specifically, adding a delay stage increases the phase difference between the CoarseClkE and CoarseClkO signals thus increasing the range of possible delays provided by these signals. Subtracting a delay stage subtracts a unit of delay from the path through the coarse delay component 308. More specifically, subtracting a delay stage decreases the phase difference between the CoarseClkE and CoarseClkO signals thus decreasing the range of possible delays provided by these signals. Delay stages may be added or subtracted via the control input signals DelayLineCNTL.

Figure 3B:
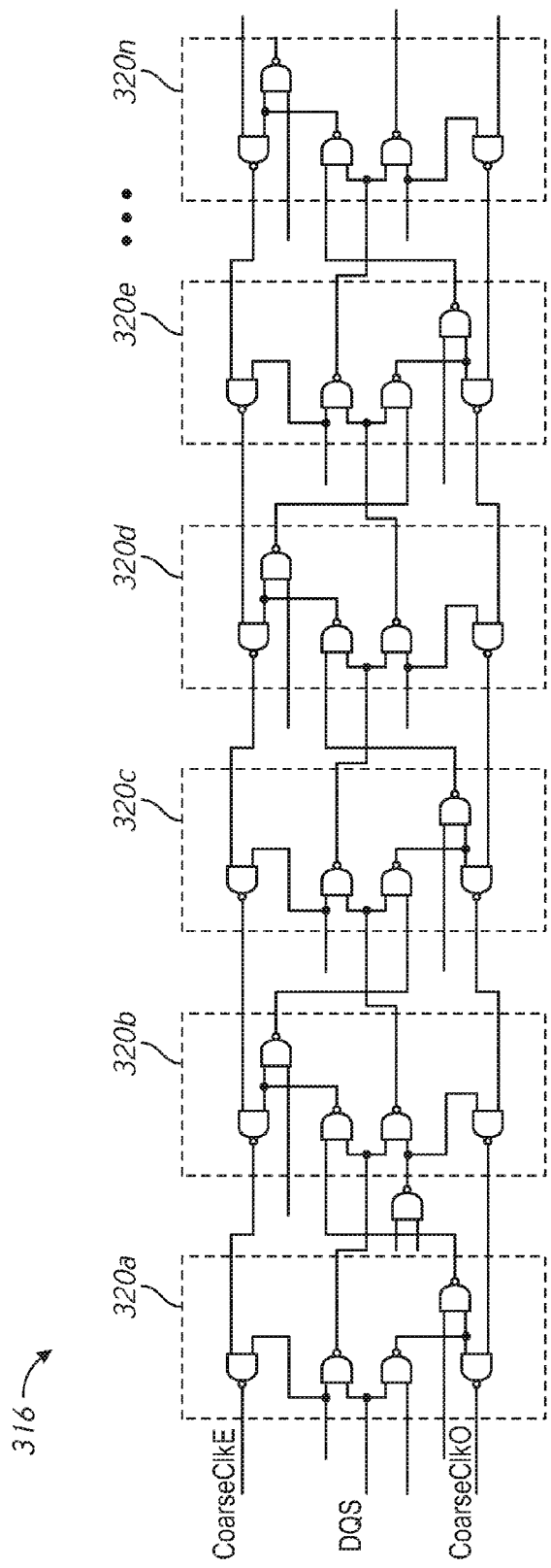
FIG. 3B is schematic diagram of coarse delay line in accordance with an embodiment of the disclosure.

FIG. 3B is schematic diagram of coarse delay line 316 in accordance with an embodiment of the disclosure. The coarse delay line 316 of FIG. 3B is a "trombone" style delay line where input and output signals are arranged on one end of the line 316 and delay stages 320*a-n* are added on an opposite end. Here, the data strobe signal DQS propagates through the enabled delayed stages 320*a-n* along two paths of different lengths to generate the CoarseClkO and CoarseClkE signals. The data strobe signal propagates down and back through the enabled delay stages 320*a-n* such that each enabled delay stage 320*a-n* is traversed twice. The currently enabled delay stage 320*a-n* that is farthest from the input/output end is the halfway point of the coarse delay line 316 that acts as the "U-turn" of the "trombone." Here, signals enter and then turn back towards previously traversed delay stages 320*a-n*. When an additional delay stage 320*a-n* is added, it is added to a far end of the currently enabled path thus creating an additional stage that is be traversed down and back.

Referring again to FIG. 3A, the fine delay component 312 may be configured in an embodiment of the disclosure as a phase mixer to mix the dual input provided by the CoarseClkE and CoarseClkO signals into a single output. The fine delay component 312 may provide output that is within a range defined on the low end by one input and on the high end by the other output. In the above example where CoarseClkE leads CoarseClkO, the leading CoarseClkE signal defines the lower bound of the delay range and the lagging CoarseClkO defines the upper bound of the delay range. Thus, in this example, the fine delay component 312 may add greater amounts of delay by providing an output that is closer to the CoarseClkO signal. Conversely, the fine phase mixer 312 may add lesser amounts of delay by providing an output that is closer to the CoarseClkE signal. The CoarseClkE and CoarseClkO signals may mixed together to provide the single ended output DQSDLY responsive to the control input signals MixerCNTL.

The controller 304 is generally configured to drive the DelayLineCNTL MixerCNTL signals responsive to the shifts2 signal. The controller 304 may have both shifter and mixer functionality. For example, the controller 304 may respond to the shifts2 signal by adding greater amounts of delay via the MixerCNTL signal to cause the fine delay component 312 to provide an output closer to a low end of the range defined by the CoarseClkE and CoarseClkO signals output from the coarse delay line 308. If lesser amounts of delay are needed, the controller 304 may respond to the shifts2 signal by lessening the delay via the Mixer-CNTL signal to cause the fine delay component 312 to provide an output closer to the high end of the range defined by the CoarseClkE and CoarseClkO signals output from coarse delay component 308. The controller 304 may continue to adjust the fine delay component 312 in this manner provided that the shifts2 signal does not call for delay adjustments that fall outside of the range currently defined by the coarse delay component 308. When the amount of delay needed by the shifts2 signal is outside the range of delay provided by the CoarseClkE and CoarseClkO signals output from coarse delay component 308, the controller 304 shifts the amount of delay provided by the coarse delay component 308 via the DelayLineCNTL signal.

Figure 4:
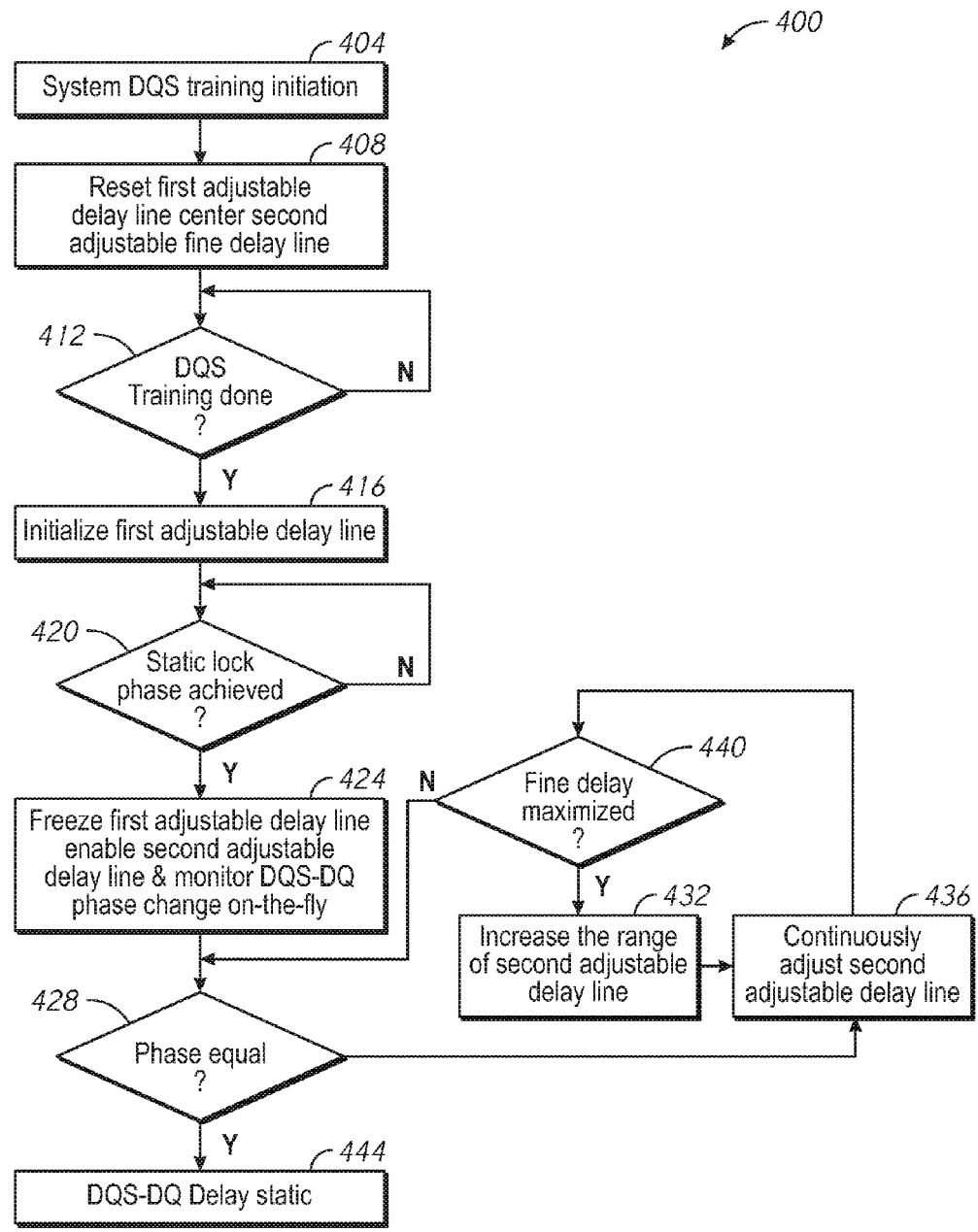
FIG. 4 is a flow chart that illustrates a method of providing a constant DQS-DQ delay in a memory in accordance with an embodiment of the present disclosure.

FIG. 4 is flow chart 400 that illustrates a method of providing a constant DQS-DQ delay in a memory device in accordance with the present disclosure. The following discussion references the memory and memory components discussed above in connection with FIG. 1 through FIG. 3A. The method illustrated by flow chart 400 begins with operation 404 where DQS training is initiated in the memory 100. A DQS training procedure is typically initiated at the beginning of memory operations, such as when power is first applied. Operation 408 may be executed following operation 404.

In operation 408, the DQS training procedure begins and the first adjustable delay line 220 is reset and the second adjustable delay line 224 is set to an initial amount. Generally, the DQS training procedure operates to obtain a measurement of the loop delay associated with the internal DQS signal pathway. The external controller that operates the memory 100 may set its DQS-DQ delay based on this measured loop delay. The loop delay as measured during the DQS training may additionally be used to initialize the delay provided by the first adjustable delay line 220. Thus, in operation 408, the first adjustable delay line 220 is reset in anticipation of receiving a value corresponding to the loop delay measurement. The second adjustable delay line 224 may be set an initial amount, which may vary depending on the implementation. In some cases, the second adjustable delay line 224 may be centered such that delay may be increased or decreased in equal amounts. In other cases, the second adjustable delay line 224 may be initially set to a low amount in anticipation of generally increasing delay as the memory 100 operates. Operation 412 may be executed following operation 408.

In operation 412, the DQS training procedure is executed. The DQS training procedure typically includes a command or series of commands issued by the external controller that operate to measure the loop delay of the internal DQS signal pathway. The external controller may measure the loop delay by issuing a data strobe on the DQS signal line along with a predetermined sequence or pattern of bits on the DQ signal lines. A particular one of the bit patterns will be captured by a latch that is clocked by the DQS signal once the DQS signal traverses the internal DQS signal pathway. The particular bit pattern latched by the DQS signal can then be read out to the external controller. Based on the particular bit pattern latched by the memory 100, the external controller may calculate the loop delay encountered by the DQS signal as the signal traversed the internal DQS signal pathway. Operation 412 includes a determination that is made as to whether or not the DQS training is completed. If DQS training is not done, operation 412 may continue. If DQS training is done, operation 416 may be executed following operation 412.

In operation 416, the first adjustable delay line 220 is initialized. Here, the loop delay as measured in the initial DQS training procedure is used to set an initial amount for the first adjustable delay line 220. As mentioned, the delay measured in the initial DQS training procedure may substantially correspond to the DQS-DQ delay utilized by the external controller in performing write operations to the memory 100. Once the initial amount for the first adjustable delay line 220 is set, the first adjustable delay 220 achieves the first step of a coarse lock. At this point, the internal data strobe signal (Dqsint) and the delay provided by the first adjustable delay line 220 (DqsIntMdl) may be substantially equal, but not yet synchronized. Thus, static lock of the first adjustable delay line 220 is the next step. Operation 420 may be executed following operation 416.

In operation 420, the first adjustable delay line 220 achieves static lock. Here, the Dqsint signal is compared to the DqsIntMdl signal through the operation of the phase detector 228. The phase detector 228 provides an output signal PD that indicates the phase difference, if any, between the Dqsint signal and the DqsIntMdl signal. The PD signal is received as input at the shift control logic 232, which provides a responsive shift control output to the first adjustable delay line 220. Here, the shift control logic 232 adds delay stages to the first adjustable delay line 220 until the PD signal indicates that the two signals are synchronized. Thus, operation 420 includes a determination that is made as to whether or not the first adjustable delay line 220 has achieved static phase lock. If static lock phase is not achieved, operation 420 may continue. When static lock phase is achieved, operation 424 may be executed following operation 420.

In operation 424, normal operations begin such that data may now be written from the external controller to the memory 100. In preparation for normal data transfer operations, the first adjustable delay line 220 is frozen. More specifically, the shift control logic de-asserts the En1 signal such that the first adjustable delay line 220 is disabled from receiving shift control inputs. In this way, the delay provided by the first adjustable delay line 220 remains fixed during normal data transfer operations. Operation 424 additionally includes enabling the second adjustable delay line 220. More specifically, the shift control logic asserts the En2 signal such that the second adjustable delay line 224 is enabled to receive shift commands. With the first adjustable delay line 220 frozen and the second adjustable delay line 224 enabled to receive shift inputs, the DQS-DQ phase change may be monitored as data is written from the external controller to the memory 100. Operation 428 may be executed following operation 424.

In operation 428, a determination is made as to whether or not the DQS-DQ phase is equal. Here, the phase detector 228 compares the model delay for the DQS signal to the actual delay for the DQS signal. As mentioned, the model delay is represented by the DqsIntMdl signal. The actual delay corresponds to the Dqsint signal. More specifically, the Dqsint signal is the externally received DQS signal, delayed by its travel through an internal DQS signal path. As discussed in connection with FIG. 2, the internal DQS signal path includes the second adjustable delay line 224 and the clock distribution tree 236, which is configured to distribute a delayed DQS signal to the data latches 216a-x. The phase detector 228 compares the DqsIntMdl signal and the Dqsint signal to provide an output signal PD that represents the phase difference between the two input signals. If the phases of DqsIntMdl signal and the Dqsint signal are not equal, operation 436 may be executed following operation 428.

In operation 436, fine delay adjustments are made to the second adjustable delay line 224. Here, the shift control logic 232 may adjust the second adjustable delay line 224 via the shifts2 signal. These adjustments to the second adjustable delay line 224 occur dynamically during normal memory operations, such as when data is being written to the memory. The shifts2 signal may include a pulse or other symbol that causes a shift register associated with the second adjustable delay line 224 to increase or decrease delay of the delay line. The number of pulses or other symbols sent may depend on the phase difference between the Dqsint and DqsIntMdl as indicated by the phase difference signal PH. As discussed in connection with FIG. 3A, the shifts2 signal may be provided to a controller 304 that, in turn, provides control signals via the MixerCNTL signal to a fine delay component 312 that is coupled to a coarse delay line 304. The fine delay component 312 may be configured to mix a dual input provided by the coarse delay component 308 into a single output. The fine delay component 312 may provide output that is within a range defined on the low end by one input and on the high end by the other output. Thus, the controller 304 may respond to the shifts2 signal by adding greater amounts of delay via a control signal that causes the fine delay component 312 to provide an output closer to the low end of the range defined by the coarse delay component 308. If lesser amounts of delay are called for, the controller 304 may respond to the shifts2 signal by lessening the delay via a control signal that causes the fine delay component 312 to provide an output closer to the high end of the range defined by the coarse delay component 308. The controller 304 may continue to adjust the fine delay component 312 in this manner provided that the shifts2 signal does not call for delay adjustments that fall outside of the range currently defined by the coarse delay component 308. In this regard, operation 440 may be executed following operation 436.

In operation 440, a determination is made as to whether or not the fine delay is maximized. More specifically, a determination is made as to whether or not the shifts2 signal calls for delay adjustments that fall outside of the range currently defined by the coarse delay component 308. If the fine delay is not maximized, operation 428 may again be executed following operation 440. Here, a determination is made as to whether or not the DQS-DQ phase is equal. As discussed above, determining whether or not the DQS-DQ phase is equal involves a phase comparison between the DqsIntMdl and the Dqsint signals. If, in operation 428, the phases of DqsIntMdl signal and the Dqsint signal are not equal, operation 436 discussed above may be executed following operation 428. If, in operation 440, the fine delay is maximized, operation 432 may be executed following operation 440.

In operation 432, the fine delay range is increased. Here, the shift control logic 232 may adjust the second adjustable delay line 224 via the shifts2 signal. These adjustments to the second adjustable delay line 224 occur dynamically as data is being written to the memory. The shifts2 signal may include a pulse or other symbol that causes a shift register associated with the second adjustable delay line 224 to increase or decrease a unit of delay from the delay line. As discussed in connection with FIG. 3A, the shifts2 signal may be provided to a controller 304 that, in turn, provides control signals to a coarse delay component 308. Here, the controller 304 adds a unit of delay to the path through the coarse delay component 308 via the control input signals Delay-LineCNTL. In embodiments where the second adjustable delay line 224 includes a "trombone" style coarse delay line, an additional delay stage is added to the far end of the currently enabled path thus creating an additional stage that is be traversed down and back. Operation 436 discussed above may be executed following operation 432.

In operation 428, if the phases of DqsIntMdl signal and the Dqsint signal are equal, operation 444 may be executed following operation 428. In operation 444, data transfer to the memory occurs without further adjustment to the second adjustable delay line 224. Monitoring of the DQS-DQ phase may continue as further data transfer occurs. Thus, the method may continue with control looping back to operation 424 for on-going monitoring.

Figure 5:
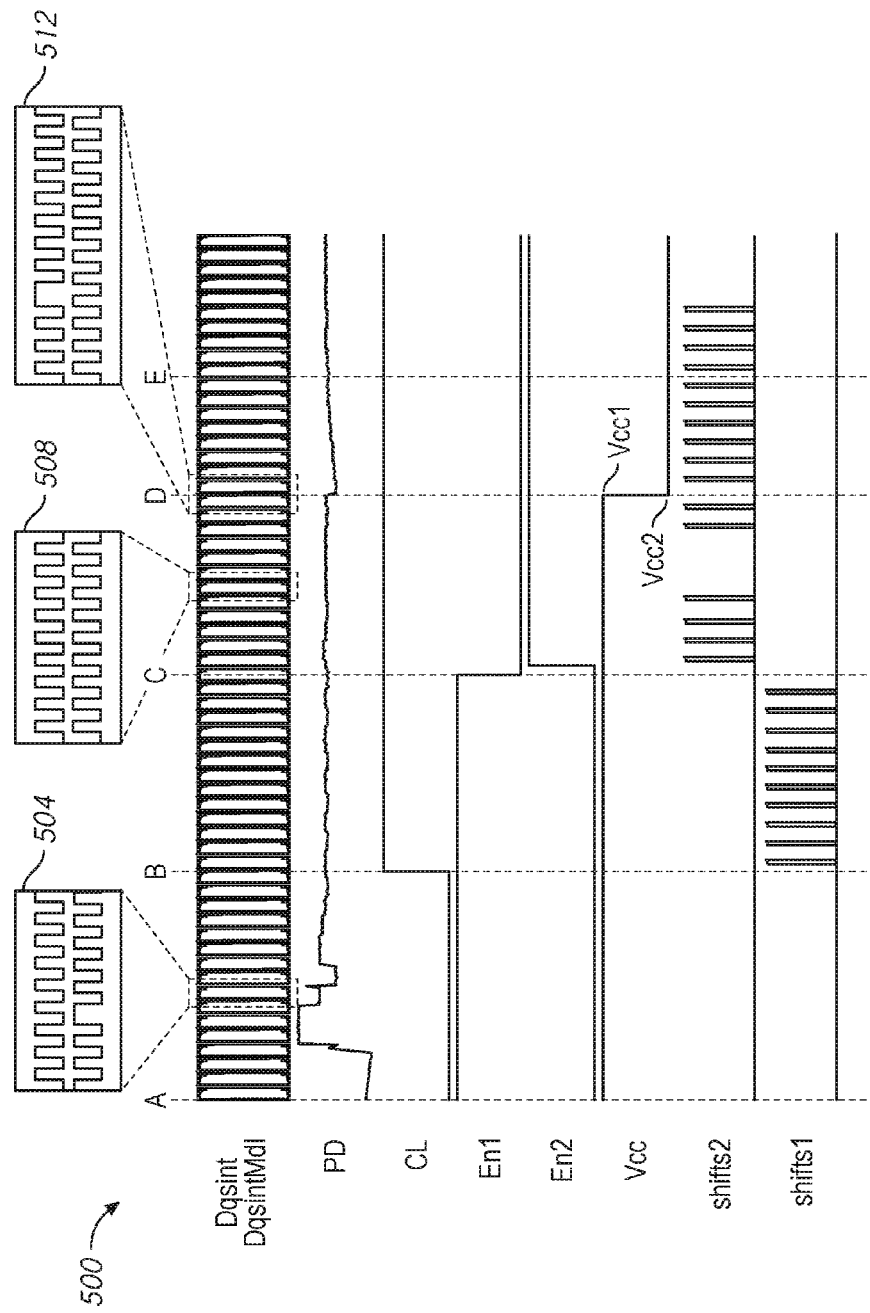
FIG. 5 is a diagram of signal traces that illustrate an example voltage drop scenario that may be encountered by a control timing circuit in accordance with an embodiment of the present disclosure.

FIG. 5 is a diagram 500 of signal traces that illustrate an example voltage drop scenario that may be encountered by a timing circuit in accordance with an embodiment of the present disclosure. The example voltage drop scenario of FIG. 5 is provided as a non-limiting example of a possible circumstance that could lead to a disruption in internal memory timing that may be corrected through the operation of present embodiments. It should be appreciated that present embodiments may also operate to correct disruptions in internal memory timing that result from other circumstances, such as changes in temperature. The following discussion references the memory and memory components discussed above in connection with FIG. 1 through FIG. 3A. Additionally, the following discussion references operations of the method of creating a constant DQS-DQ delay in a memory that is discussed in connection with FIG. 4.

FIG. 5 includes overlapping signal traces for the Dqsint and DqsIntMdl signals. The Dqsint signal is the externally received DQS signal, delayed by its travel through an internal DQS signal path. The DqsIntMdl signal is provided by the first adjustable delay line 220. Once the first adjustable delay line 220 is set during the initialization procedure, the DqsIntMdl corresponds to the DQS-DQ delay used by the external controller in writing data to the memory 100. The PD signal is the output of the phase detector 228 and represents a phase difference comparison between the DqsIntMdl signal and the Dqsint signal. The CL signal is internal the shift control logic 232 and is asserted when coarse lock is achieved in the first adjustable delay line 220. The En1 signal is an enable signal that is output from the shift control logic 232 to enable receipt of shift commands at the first adjustable delay line 220 during the initialization procedure. The En2 signal is an enable signal that is output from the shift control logic 232 to enable receipt of shift commands at the second adjustable delay line 224 during normal data transfer operations of the memory 100. The Vcc signal represents the power supply level currently supplied to the memory 100. The shifts1 signal corresponds to shift commands output from the shift control logic 232 during the initialization procedure. The shifts2 signal corresponds to shift commands output from the shift control logic 232 during normal data transfer operations.

The example voltage drop scenario illustrated in FIG. 5 begins with a coarse lock portion of an initialization procedure, which takes place between time point A and time point B. At time point A, the memory begins the initialization procedure. The initialization procedure may begin when the memory 100 begins operations such as on power-up. Once power is applied, the memory 100 begins a DQS training procedure. The DQS training procedure generally operates to measure a loop delay of an internal DQS signal pathway. The measured loop delay is used to set the external controller's DQS-DQ delay and is used to set an initial value for the first adjustable delay line 220. The DQS training procedure is described in greater detail above in connection with operation 412 of FIG. 4. Once the initial value for the first adjustable delay line 220 is set, coarse lock of the first adjustable delay line 220 is achieved as indicated by the rising edge of the CL signal that occurs at time point B in FIG. 5.

After the first adjustable delay line 220 achieves coarse lock, a static lock portion of the initialization procedure takes place between time point B and time point C. The static lock portion of the initialization procedure generally includes the PD signal being received as input at the shift control logic 232, which drives the shifts1 signal so as to provide a responsive shift control output to the first adjustable delay line 220. The static lock portion of the initialization procedure is described in greater detail above in connection with operation 420 of FIG. 4. Once the static lock for the first adjustable delay line 220 is achieved, normal data transfer operations for the memory 100 may begin. Normal data transfer operations are indicated in FIG. 5 by the falling edge of the En1 signal and the rising edge of the En2 signal, each of which occurs at time point C. Here, the first adjustable delay line 220 is disabled from receiving shift control commands and the second adjustable delay line 224 is enabled to receive shift commands.

After the first adjustable delay line 220 achieves static lock, monitoring of the second adjustable delay line 224 begins after time point C. With the first adjustable delay line 220 frozen, its delay remains fixed during normal data transfer operations. With the second adjustable delay line 224 enabled to receive shift commands, the DQS-DQ phase change may be monitored as data is written from the external controller to the memory 100. In the example scenario of FIG. 5, DQS-DQ phase change remains relatively constant between time point C and time point D. However, some adjustment to the second adjustable delay line 224 does occur, as indicated by the occasional signal pulses on the shifts2 signal line between time point C and time point D. More specifically, when the En2 signal goes high after the En1 signal goes low, the phase detector input (PD) to the shift control logic generates shifts2 signals that may add or remove delay in the second adjustable delay line 224. When no shifts2 signal is generated, a lock condition is achieved in the loop. FIG. 5 is an illustration that includes conditions that might occur in an example case. As shown in FIG. 5, some PVT variations may occur after an initial lock is achieved. Accordingly, some shifts2 signals may be generated after time point C to account for these PVT variations. In this way, the system operates to a achieve a constant delay control tracking.

At time point D, the example voltage drop event occurs. As can be seen in FIG. 5, the power supply voltage Vcc of the memory 100 drops from voltage Vcc1 to voltage Vcc2. For example, the power supporting voltage Vcc may drop by approximately 120 mV. This drop in the power supply voltage results in a slowing of the rate at which the DQS signal travels through the internal DQS signal pathway. The impact of this slowing is reflected in a later arrival of the Dqsint signal at the phase detector 228. The drop in the power supply voltage does not impact the DqsIntMdl signal as this signal is generated by the first adjustable delay line 220, which, as discussed above, may be regulated. Thus, a phase difference develops between the Dqsint signal and the DqsIntMdl as a result of the drop in the power supply voltage. This phase difference can be seen in FIG. 5 as the PD signal drops at time point D.

Following the example voltage drop at point D, monitoring of the DQS-DQ phase and adjustments to the second adjustable delay line 224 recover normal operations of the memory 100. Here, the shift control logic 232 drives the shifts2 signal so as to provide coarse and fine delay adjustments to the second adjustable delay line 224. These adjustments to the second adjustable delay line 224 occur dynamically as data is being written to the memory 100. The adjustment of the second adjustment delay line 224 is illustrated by the signal pulses on the shifts2 signal line following time point D. The coarse and fine delay adjustments are described in greater detail in connection with operation 420 through operation 444 of FIG. 4.

Figure 6:
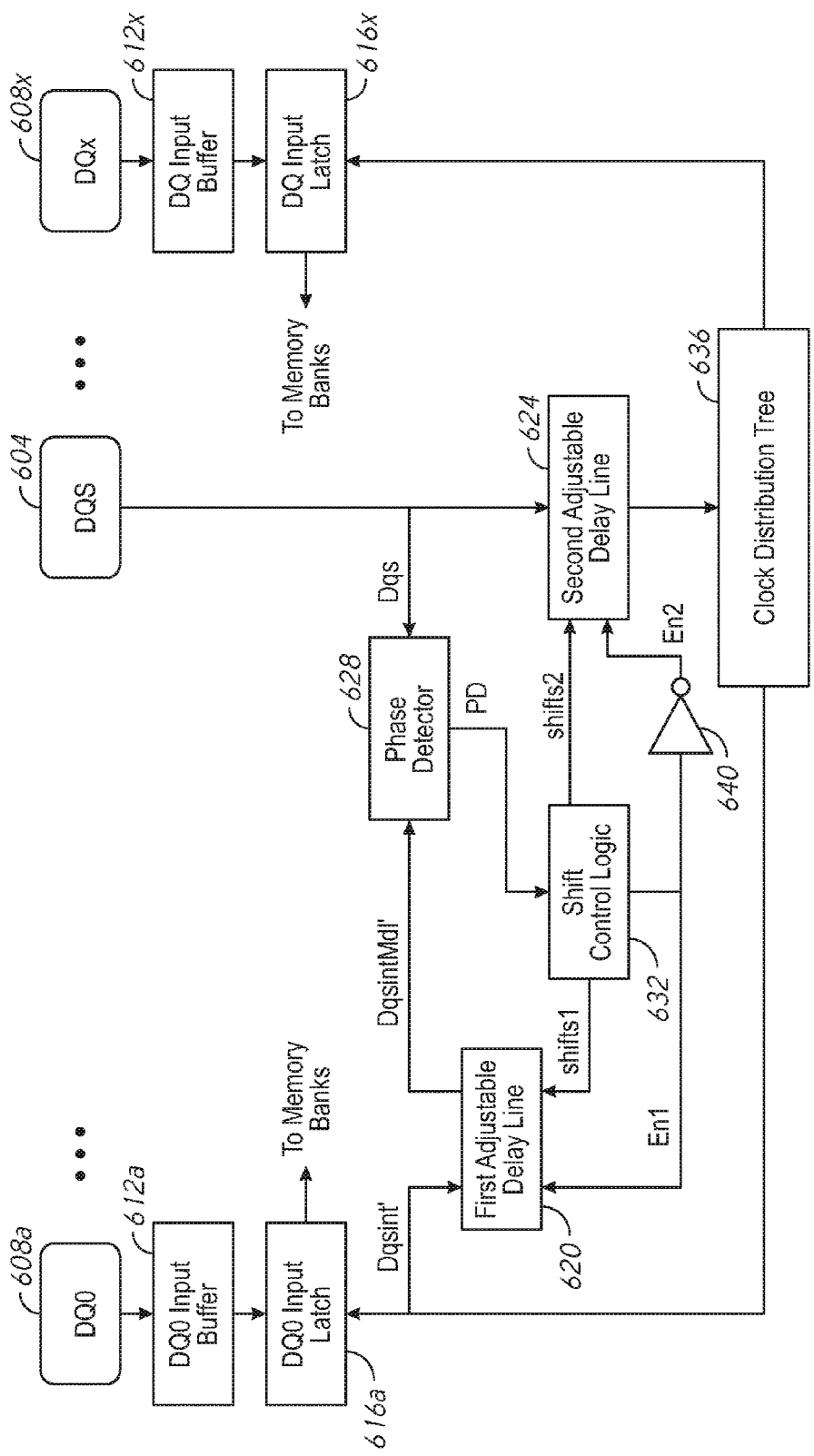
FIG. 6 is a block diagram of an alternative timing control circuit in accordance with an embodiment of the present disclosure.

FIG. 6 is a block diagram of a timing control circuit 600 in accordance with the present disclosure. The timing control circuit 600 is an alternative configuration for the timing control circuit of FIG. 2. The components of the timing control circuit 600 of FIG. 6 function in a similar manner to corresponding components of the timing control circuit 200 of FIG. 2. However, the components of FIG. 6 are arranged differently. Thus, the timing control circuit 600 is generally configured to control the internal timing of a data strobe signal DQS such that the DQS signal latches data signals DQ0-DQX with appropriate timing. The DQS signal is received as input from an external source through DQS pad 604. The DQ0-DQX signals are received as input from an external source through DQ pads 608a-x. Each DQ pad 608a-x is coupled to an input buffer 612a-x. The input buffers 612a-x may be configured to receive data input signals from pads 608a-x and to condition the signals such as by amplification. The input buffers 612a-x provide amplified data signals as output, which are captured by data latches 616a-x responsive to the DQS signal.

The timing control circuit 600 additionally includes a first adjustable delay line 620, a second adjustable delay line 624, a phase detector 628, shift control logic 632, a buffer 640, a clock distribution tree 636. Each of these components function in a similar manner to like components in the timing control circuit 200 of FIG. 2. This difference between the different embodiments lies in the interconnection between components. In the timing control circuit 200 of FIG. 2, the first adjustable delay line 224 provides input DqsintMdl to the phase detector 228 after having received input directly from the DQS pad 204. The second input to the phase detector 228 receives input Dqsint that has traversed the internal DQS signal pathway. In the timing control circuit 600 of FIG. 6, the first adjustable delay 624 provides input DqsintMdl' to the phase detector 628 after having received input Dqsint' that has traversed the internal DQS signal pathway. The second input to the phase detector 228 receives input Dqs directly from the DQS pad 604. The different connections of FIG. 6 are alternatives to those of FIG. 2 and have no substantive impact on the circuit functionality. Thus, the timing control circuit 600 behaves substantially as described above in connection with FIG. 2 through FIG. 5.

The above specification, examples and data provide a complete description of the structure and use of exemplary embodiments of the invention as defined in the claims. Although various embodiments of the claimed invention have been described above with a certain degree of particularity, or with reference to one or more individual embodiments, those skilled in the art could make numerous alterations to the disclosed embodiments without departing from the spirit or scope of the claimed invention. Other embodiments are therefore contemplated. It is intended that all matter contained in the above description and shown in the accompanying drawings shall be interpreted as illustrative only of particular embodiments and not limiting. Changes in detail or structure may be made without departing from the basic elements of the invention as defined in the following claims.

The foregoing description has broad application. The discussion of any embodiment is meant only to be explanatory and is not intended to suggest that the scope of the disclosure, including the claims, is limited to these examples. In other words, while illustrative embodiments of the disclosure have been described in detail herein, the inventive concepts may be otherwise variously embodied and employed, and the appended claims are intended to be construed to include such variations, except as limited by the prior art.

The invention claimed is:

1. An apparatus, comprising:
   a first adjustable delay line configured to provide a delay corresponding to a loop delay of a data strobe signal pathway internal to a memory;
   a second adjustable delay line included in the data strobe signal pathway; and
   a timing control circuit coupled to the first and second adjustable delay lines and configured to adjust a delay of the second adjustable delay line responsive to output from the first adjustable delay line and the data strobe signal pathway, wherein the timing control circuit comprises:
      a phase detector coupled to receive a fust input from the first adjustable delay line and a second input front die data strobe signal pathway and to generate an output signal that is indicative of a phase difference between the first and second inputs, and
      a shift control logic coupled to receive the output signal of the phase detector and to generate respective shift commands that adjust the first and second adjustable delay lines.

2. The apparatus of claim 1, wherein during memory operations where data is written to the memory, the first adjustable delay line is disabled from responding to shift commands from the shift control logic and the second adjustable delay line is enabled to respond to shift commands from the shift control logic.

3. The apparatus of claim 1, wherein:
   the first adjustable delay line includes an input that is coupled to an end of the data strobe signal pathway that is proximate to a data strobe pad; and
   the second input to the phase detector is coupled to an end of the data strobe signal pathway that is proximate to a data latch.

4. The apparatus of claim 1, wherein:
   the first adjustable delay line includes an input that is coupled to an end of the data strobe signal pathway that is proximate to a data latch; and
   the second input to the phase detector is coupled to an end of the data strobe signal pathway that is proximate to a data strobe pad.

5. The apparatus of claim 1, wherein the first adjustable delay line is regulated.

6. The apparatus of claim 1, wherein the delay provided by the first adjustable delay line is set during an initialization procedure that includes a coarse lock portion and a static lock portion.

7. The apparatus of claim 6, wherein the coarse lock portion of the initialization procedure includes a training procedure that measures the loop delay of the data strobe signal pathway.

8. The apparatus of claim 1, wherein the second adjustable delay line comprises:
   a coarse delay component that is configured to provide a leading signal that defines a lower bound of delay and a lagging signal that defines an upper bound of delay; and
   a fine delay component coupled to the coarse delay component and configured to provide a delay for the second adjustable delay line that is within the upper and lower bounds defined by the coarse delay line.

9. The apparatus of claim 1, wherein the data strobe signal pathway further comprises a clock distribution tree.

10. An apparatus, comprising:
    an unregulated delay line configured to receive a data strobe signal and to provide a delayed data strobe signal internal to a memory;
    a clock distribution tree coupled to receive the delayed data strobe signal from the unregulated delay line and to distribute the delayed data strobe to at least one data latch for clocking of data corresponding to the data strobe;
    a timing control circuit coupled to the unregulated delay line and configured to adjust an amount of delay provided by the unregulated delay line as the data is written to the memory; and
    a regulated delay line coupled to the timing control circuit and configured to provide a delay corresponding to a loop delay of a data strobe signal pathway that includes the unregulated delay line and the clock distribution tree;
    wherein the timing control circuit is configured to adjust the amount of delay provided by the unregulated delay line responsive to output from the regulated delay line.

11. The apparatus of claim 10, wherein the timing control circuit comprises:
    a phase detector coupled to receive a first input from the regulated delay line and a second input from the data strobe signal pathway and to generate an output signal that is indicative of a phase difference between the first and second inputs; and
    a shift control logic coupled to receive the output signal of the phase detector and to generate responsive shift commands that adjust the regulated and unregulated delay lines.

12. The apparatus of claim 11, wherein the shift control logic adjusts the regulated delay line during an initialization procedure and not during memory operations when data is written to the memory.

13. A method, comprising:
    generating a first data strobe input through a regulated delay line;
    generating a second data strobe input through a data strobe signal pathway that includes an unregulated delay line and a clock distribution tree;
    receiving the first and second data strobe inputs at a phase detector;
    determining, by the phase detector, a phase difference between the first and second data strobe inputs;
    generating a shift command by a shift control logic based on the phase difference determined by the phase detector; and
    providing the shift command to an unregulated delay line so as to adjust an amount of delay that the unregulated delay line provides to a data strobe as data corresponding to the data strobe is received.

14. The method of claim 13, further comprising:
setting a delay for the regulated delay line through an initialization procedure that includes a coarse lock portion and a static lock portion.

15. The method of claim 14, wherein the coarse lock portion of the initialization procedure includes a training procedure that measures a loop delay of the data strobe signal pathway.

16. The method of claim 13, wherein providing the shift command to the delay line includes providing the shift command to at least one of a coarse delay line and a fine phase mixer.

17. An apparatus, comprising:
a first adjustable delay line configured to provide a delay corresponding to a loop delay of a data strobe signal pathway internal to a memory, wherein the delay provided by the first adjustable delay line is set during an initialization procedure that includes a coarse lock portion and a static lock portion;
a second adjustable delay line included in the data strobe signal pathway; and
a timing control circuit coupled to the first and second adjustable delay lines and configured to adjust a delay of the second adjustable delay line responsive to output from the first adjustable delay line and the data strobe signal pathway.

18. The apparatus of claim 17, wherein the coarse lock portion of the initialization procedure includes a training procedure that measures the loop delay of the data strobe signal pathway.

19. An apparatus, comprising:
a first adjustable delay line configured to provide a delay corresponding to a loop delay of a data strobe signal pathway internal to a memory;
a second adjustable delay line included in the data strobe signal pathway, the second adjustable delay line comprising:
a coarse delay component that is configured to provide a leading signal that defines a lower bound of delay and a lagging signal that defines an upper bound of delay, and
a fine delay component coupled to the coarse delay component and configured to provide a delay for the second adjustable delay line that is within the upper and lower bounds defined by the coarse delay line; and
a timing control circuit coupled to the first and second adjustable delay lines and configured to adjust a delay of the second adjustable delay line responsive to output from the first adjustable delay line and the data strobe signal pathway.

\* \* \* \* \*

UNITED STATES PATENT AND TRADEMARK OFFICE
CERTIFICATE OF CORRECTION

PATENT NO. : 10,026,462 B1
APPLICATION NO. : 15/596988
DATED : July 17, 2018
INVENTOR(S) : Yantao Ma et al.

It is certified that error appears in the above-identified patent and that said Letters Patent is hereby corrected as shown below:

In the Specification

| | Reads | Should Read |
|---|---|---|
| Column 3, Line 28 | "The column address decoder 128" | --The column address decoder 136-- |
| Column 11, Line 19 | "a coarse delay line 304." | --a coarse delay line 308.-- |

In the Claims

| | | |
|---|---|---|
| Column 15, Line 29 | "to receive a fust input" | --to receive a first input-- |
| Column 15, Line 30 | "a second input front die" | --a second input from the-- |

Signed and Sealed this
Nineteenth Day of March, 2019

Andrei Iancu
*Director of the United States Patent and Trademark Office*